(12) United States Patent
Feighery

(10) Patent No.: US 7,202,699 B1
(45) Date of Patent: Apr. 10, 2007

(54) VOLTAGE TOLERANT INPUT BUFFER

(75) Inventor: Gareth Feighery, Santa Cruz, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 108 days.

(21) Appl. No.: 10/940,161

(22) Filed: Sep. 13, 2004

Related U.S. Application Data

(60) Provisional application No. 60/503,345, filed on Sep. 15, 2003.

(51) Int. Cl.
*H03K 19/0175* (2006.01)
*H03K 19/094* (2006.01)

(52) U.S. Cl. .............................. 326/81; 326/82; 326/83; 326/84

(58) Field of Classification Search ............. 326/81–85
See application file for complete search history.

(56) References Cited

U.S. PATENT DOCUMENTS

| | | | |
|---|---|---|---|
| 4,638,187 A | | 1/1987 | Boler et al. |
| 4,877,978 A | | 10/1989 | Platt |
| 4,885,485 A | | 12/1989 | Leake et al. |
| 4,978,905 A | | 12/1990 | Hoff et al. |
| 5,166,558 A | * | 11/1992 | Ohsawa ........................ 326/71 |
| 5,488,320 A | * | 1/1996 | Carvella et al. .............. 327/65 |
| 5,534,806 A | | 7/1996 | Gowni et al. |
| 5,559,447 A | | 9/1996 | Rees |
| 5,568,081 A | | 10/1996 | Lui et al. |
| 5,570,043 A | | 10/1996 | Churchill |
| 5,600,261 A | | 2/1997 | White et al. |
| 5,721,508 A | | 2/1998 | Rees |
| 5,828,262 A | | 10/1998 | Rees |
| 5,872,464 A | | 2/1999 | Gradinariu |
| 5,898,315 A | | 4/1999 | Knaack |
| 5,914,844 A | | 6/1999 | Lutley et al. |
| 5,917,335 A | | 6/1999 | Rees |
| 6,008,695 A | * | 12/1999 | Sichert et al. .............. 330/253 |
| 6,023,175 A | * | 2/2000 | Nunomiya et al. ........... 326/68 |
| 6,023,176 A | | 2/2000 | Chester |
| 6,114,881 A | * | 9/2000 | Eum ........................... 327/53 |
| 6,191,636 B1 | | 2/2001 | Cress et al. |
| 6,222,387 B1 | | 4/2001 | Meng et al. |
| 6,225,819 B1 | | 5/2001 | Rees et al. |
| 6,236,225 B1 | * | 5/2001 | Bertotti et al. .............. 324/769 |
| 6,236,255 B1 | * | 5/2001 | Oguri .......................... 327/310 |
| 6,237,107 B1 | | 5/2001 | Williams et al. |
| 6,282,146 B1 | | 8/2001 | Guo et al. |

(Continued)

OTHER PUBLICATIONS

EIA/JEDEC Standard—Aug. 1995—Electronic Industries Association High speed transceiver logic (hstl) a 1.5 v output buffer supply voltage based interface standard for digital integrated circuits.

*Primary Examiner*—Rexford Barnie
*Assistant Examiner*—Dylan White
(74) *Attorney, Agent, or Firm*—Blakely, Sokoloff, Taylor & Zafman LLP

(57) ABSTRACT

A method and an apparatus are described for a voltage tolerant input buffer. An embodiment of an input buffer includes a differential circuit and a plurality of switches coupled with the differential circuit. The plurality of switches applies a voltage to the differential circuit in a first state and isolate the differential circuit from the voltage in a second state.

18 Claims, 5 Drawing Sheets

U.S. PATENT DOCUMENTS

| | | |
|---|---|---|
| 6,288,581 B1 * | 9/2001 | Wong .................. 327/108 |
| 6,323,701 B1 | 11/2001 | Gradinariu et al. |
| 6,329,840 B1 | 12/2001 | Moyal |
| 6,333,663 B1 | 12/2001 | Lee |
| 6,380,762 B1 | 4/2002 | Pancholy et al. |
| 6,411,150 B1 | 6/2002 | Williams |
| 6,417,696 B1 | 7/2002 | Maheshwari |
| 6,417,708 B1 * | 7/2002 | Fiedler .................. 327/170 |
| 6,441,651 B2 | 8/2002 | Lien |
| 6,469,548 B1 | 10/2002 | Huang et al. |
| 6,483,386 B1 | 11/2002 | Cress et al. |
| 6,525,572 B1 * | 2/2003 | Barnes .................. 327/52 |
| 6,525,672 B2 * | 2/2003 | Chainer et al. .......... 340/904 |
| 6,529,036 B1 | 3/2003 | Rai |
| 6,538,485 B1 | 3/2003 | Churchill |
| 6,556,048 B1 | 4/2003 | Dunne |
| 6,580,291 B1 | 6/2003 | Lutley |
| 6,583,646 B1 | 6/2003 | Patel et al. |
| 6,586,990 B2 * | 7/2003 | Udo et al. .................. 330/9 |
| 6,693,469 B2 | 2/2004 | Prodanov |
| 6,727,735 B2 * | 4/2004 | Park .................. 327/157 |
| 6,784,700 B1 | 8/2004 | Hunt et al. |
| 6,784,717 B1 | 8/2004 | Hunt et al. |
| 6,850,108 B2 | 2/2005 | Shin |
| 6,924,687 B2 | 8/2005 | Reed et al. |
| 6,937,080 B2 * | 8/2005 | Hairapetian .............. 327/210 |
| 6,975,169 B2 * | 12/2005 | Fifield et al. .............. 330/253 |

* cited by examiner

VOLTAGE TOLERANT INPUT BUFFER

This application claims the benefit of U.S. Provisional Patent Application No. 60/503,345, filed Sep. 15, 2003.

FIELD OF THE INVENTION

The invention relates generally to electronic circuits. More particularly, the invention relates to a voltage tolerant input buffer.

BACKGROUND

An input buffer may be utilized for connection of an input/output (I/O) system to another system, device, or component. In modern electronics, buffers will generally include integrated circuits (ICs). As integrated circuit process technology has advanced to higher densities, the feature size of transistors has been reduced, thus enabling system operations at low voltages and high speeds and providing for high-density device layout. Another result of reduced feature size that can cause complications is the reduction in gate oxide voltage tolerance in thinner oxide devices. With the reduction in voltage tolerance, higher voltages may damage input/output circuits that are designed for low voltage, thus limiting the range of applications for circuit components.

However, certain conventional I/O standards may require that a system be interfaced with external voltages that are higher than the internal voltages used within the system. Thus, it may be necessary to interface a system utilizing low-voltage transistors to high voltage systems, thereby posing a challenge in I/O system design.

In a conventional input buffer, the buffer circuit may be constructed with high voltage components. When the buffer circuit is deactivated, the input transistors of a conventional system may be capable of tolerating higher voltages. However, such voltage support is provided at the expense of adequate performance. Among the issues regarding the operation of an I/O system are the headroom and the duty cycle for a signal. Headroom is a limitation on a transferred signal, representing the amount of additional signal above the nominal input level that can be sent into or out of an electronic device before distortion occurs. Duty cycle represents the ratio between the length of a signal pulse to the signal period, with a signal presenting a perfect square wave, with a signal length equal to one-half of the period, has a duty cycle of 0.5 or 50%. In higher voltage operation, a conventional I/O system will provide low headroom, a poor duty cycle, and high power dissipation.

BRIEF DESCRIPTION OF THE DRAWINGS

The present invention is illustrated by way of example, and not by way of limitation, in the figures of the accompanying drawings in which like reference numerals refer to similar elements, and in which.

DETAILED DESCRIPTION

Figure 1:
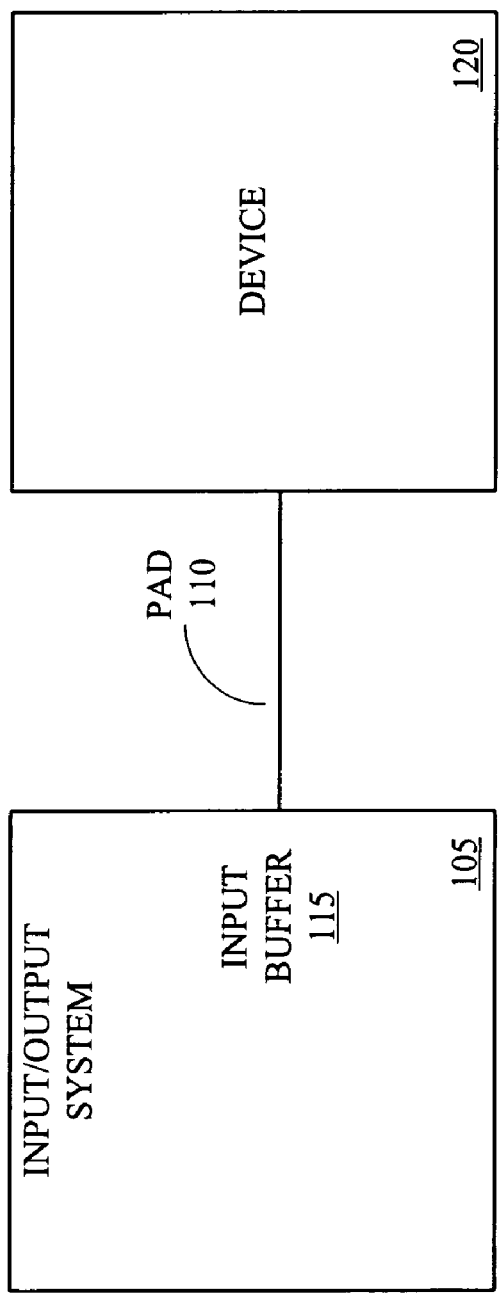
FIG. 1 is an illustration of a input/output system including an input buffer for connections to an I/O pad.

An embodiment of the present invention provides for a voltage tolerant input buffer for an I/O system.

In one embodiment of the invention, an input buffer may operate with a plurality of different voltage levels. In one embodiment of the invention, the input buffer includes a low voltage system that is activated when lower voltages are utilized and that is deactivated when higher voltages are utilized.

In one embodiment of the invention, an input buffer includes low voltage components, such as thin oxide transistor components. The input buffer further includes high voltage components, such as thick oxide transistor components. The absolute thickness of oxide layers for transistor components will vary according to the type of component technology that is utilized, with higher voltage (thick oxide) devices having a relatively thicker oxide layer than low voltage (thin oxide) devices. Transistor components may be evaluated to determine what voltage levels may be applied without generating an electrostatic field that is large enough to break down the oxide layer of the transistor. In one possible example, an input buffer may include MOS (metal oxide semiconductor) transistors that are manufactured using a 0.13 µm technology (indicating a transistor length of 0.13 µm). For such a transistor, "thin oxide" may relate to a minimum width for the transistor's diffusion or tap region of 0.15 nm, while "thick oxide" may refer to a minimum width of 0.62 nm. In this example, the thin oxide devices are referred to as 1.2V devices to indicate that the devices can tolerate a nominal voltage of 1.2 volts, and the thick oxide devices are referred to as 2.5V devices to indicate that the devices can tolerate a nominal voltage of 2.5 volts.

In one embodiment of the invention, a low voltage system for the input buffer is deactivated when higher voltages are encountered, thereby allowing operation without creating over-voltage damage to the low voltage components. In one embodiment, high voltage devices are switched to isolate or separate the low voltage components from higher voltages when the low voltage system is deactivated. In one embodiment of the invention, an input buffer ensures that, when low voltage operation is deactivated, the input buffer can tolerate the application of a higher voltage without unduly reducing the lifetime of any low voltage devices. In one embodiment, an input buffer provides acceptable operating characteristics at both lower voltages and higher voltages.

In one embodiment of the invention, an input buffer includes both lower voltage components (such as components designed for 1.2 volts) and higher voltage components (such as components designed for 2.5 volts). In one embodiment, the input buffer includes two differential transistor pairs, the differential transistor pairs utilizing lower voltage components. Each of the differential transistor pairs has a current source, the current sources utilizing higher voltage components. In one embodiment, the input buffer further includes higher voltage switches to couple the differential transistor pairs and current sources to a power supply voltage and to input signals.

In one embodiment of the invention, the lower voltage components of an input buffer are isolated from excess voltages in higher voltage operations. When the low voltage operation of the input buffer is activated, the supply voltage switches are on and the buffer operates as two complementary differential transistor pairs. When the low voltage operation of the input buffer is deactivated, the higher voltage switch devices and the differential transistor pair current sources are turned off to prevent damage from the higher supply voltage. Further, an additional higher voltage switch is turned on to pass the signal from the I/O pad through additional high voltage switches to the tail nodes and output nodes of the differential transistor pairs, thereby isolating the lower voltage components from high voltage signals. In one embodiment, the isolation of the lower voltage components from the higher voltage supply and signals protects the lower voltage components from voltages that exceeding the maximum rated voltage for the devices.

In one embodiment of the invention, when deactivated, an input buffer circuit will tolerate an application of a higher voltage supply and signals without decreasing the lifetime of any of the devices below a reasonable period, such as 10 years. Further, when the lower voltage operation for the input buffer circuit is activated, the circuit tolerates a lower voltage (such as up to 1.64 volt supply) without unduly decreasing device lifetime, and while maintaining good duty cycle when powered from a 1.34V supply. In addition, an embodiment of the invention may provide for reduced power dissipation, improved headroom, and superior duty cycle in comparison to a conventional circuit design.

In a particular embodiment of the invention, an input buffer circuit may be implemented in the design of a robust high speed transceiver logic (HSTL) input buffer, which may be used as part of a multi-standard configurable I/O system. HSTL is a recognized industry standard that certain I/O circuits may be required to comply with. See EIA/JEDEC (Electronic Industries Association/Joint Electron Device Engineering Council) Standard JESD8-6, "Addendum No. 6 To JESD8—High Speed Transceiver Logic (HSTL)—A 1.5 V Output Buffer Supply Voltage Based Interface Standard For Digital Integrated Circuits", August 1995. The use of an embodiment in HSTL operation thereby provides greater flexibility and improved performance over conventional circuits. However, embodiments of the invention are not limited to any particular type of operation, and may be utilized with other types of logic and I/O design.

In one embodiment of the invention, the components of an input buffer are metal oxide semiconductor (MOS) devices. In one embodiment, an input buffer includes a first differential transistor pair utilizing positive-channel metal oxide semiconductor (PMOS) devices and a second differential transistor pair utilizing negative-channel metal oxide semiconductor (NMOS) devices. In one embodiment of the invention, lower voltage devices include thin oxide MOS devices and high voltage devices include thick oxide MOS devices.

FIG. 1 is an illustration of an input/output system including an input buffer for connections to an I/O pad. In this illustration, an I/O system 105 includes a pad connection 110, which in this illustration is connected to a device 120, the I/O system 105 supporting transfer of signals with the device 120. In one embodiment of the invention, the I/O system includes an input buffer 115 to receive signals from the device 120. The voltage levels utilized in operation of the input buffer 115 may vary. For example, the I/O system 105 may operate according to specifications that require coupling with a relatively high voltage. In one example, the input buffer 115 may be required to operate both at a higher voltage and a lower voltage.

In one embodiment of the invention, the input buffer 115 includes high voltage components and low voltage components. The high voltage components may include thick oxide semiconductor devices, and the low voltage devices may include thin oxide semiconductor devices. When low voltage signals are applied to the input buffer 115, then a low voltage system is activated and the lower supply voltage is supplied to the low voltage components, thereby providing good system performance. When a high voltage is applied to the input buffer 115, then the low voltage components are isolated or separated from the higher voltage supply and signals, thereby allowing toleration of the higher voltage without significantly decreasing the life span of system components.

Figure 2:
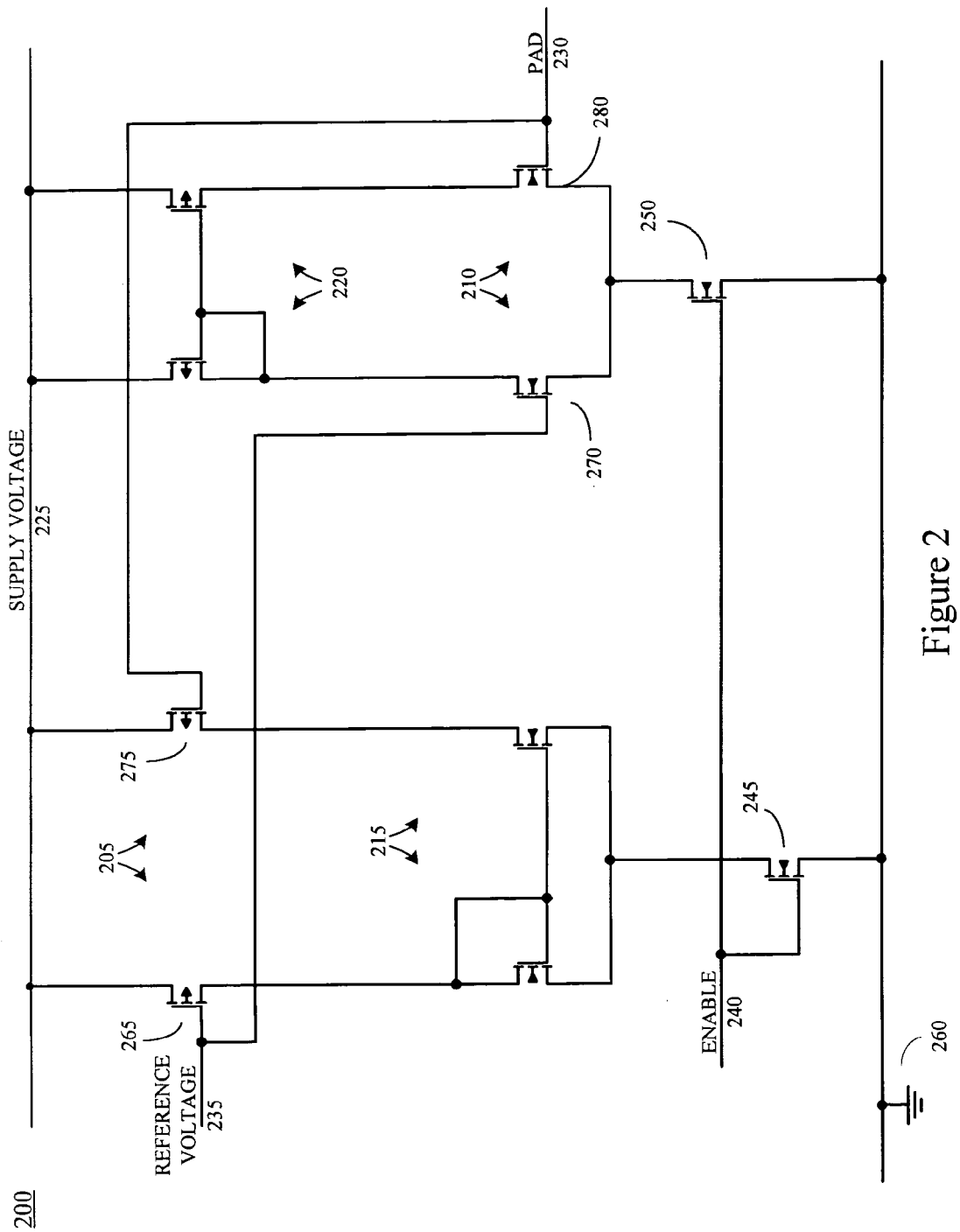
FIG. 2 is an illustration of a conventional input buffer.

FIG. 2 is an illustration of a conventional input buffer. In this example, a buffer 200 includes a first differential transistor pair 205 and a second differential transistor pair 210. As illustrated, the first differential transistor pair 205 includes a pair of PMOS transistor devices, a first PMOS transistor device 265 and a second PMOS transistor device 275. The second differential transistor pair 210 includes a pair of NMOS transistor devices, a first NMOS transistor device 270 and a second NMOS transistor device 280.

The sources of the first differential transistor pair 205 are coupled with a supply voltage 225. The drains of the first differential transistor pair 205 are coupled with a first current source 215, constructed as a current mirror utilizing two NMOS transistor devices. The first current source is coupled with a first NMOS transistor switch 245, which is in turn coupled with ground 260. The first NMOS transistor switch is controlled by an enable signal 240.

The sources of the second differential transistor pair 210 are coupled with a second current source 220, constructed as a current mirror utilizing two PMOS transistor devices. The second current source 220 is coupled with the supply voltage 225. The drains of the second differential transistor pair 210 are coupled with a second NMOS transistor switch 250, which is also controlled by the enable signal 240. The second NMOS transistor switch 250 is also coupled with ground 260.

For signal operation, a reference voltage 235 is coupled with the gate of the first PMOS transistor device 265 of the first differential transistor pair and the gate of the first NMOS transistor device 270 of the second differential transistor pair 210. A pad connection 230 to the input buffer 200 for signal reception is coupled with the gate of the second PMOS transistor device 275 of the first differential transistor pair 205 and the gate of the second NMOS transistor device 280 of the second differential transistor pair 210.

In the conventional input buffer, the supply voltage 225 is coupled with the devices making up the differential transistor pairs and the current sources. If a higher voltage were applied, there would be a chance of an over-voltage situation, which may result in shortened life span for the components. The components of the input buffer 200 are thus higher voltage devices. Deactivating the enable line 240 disconnects the differential transistor pairs from ground 260. When deactivated, the conventional supply may support a higher voltage at the expense of poor duty cycle, low headroom, and high power dissipation.

Figure 3:
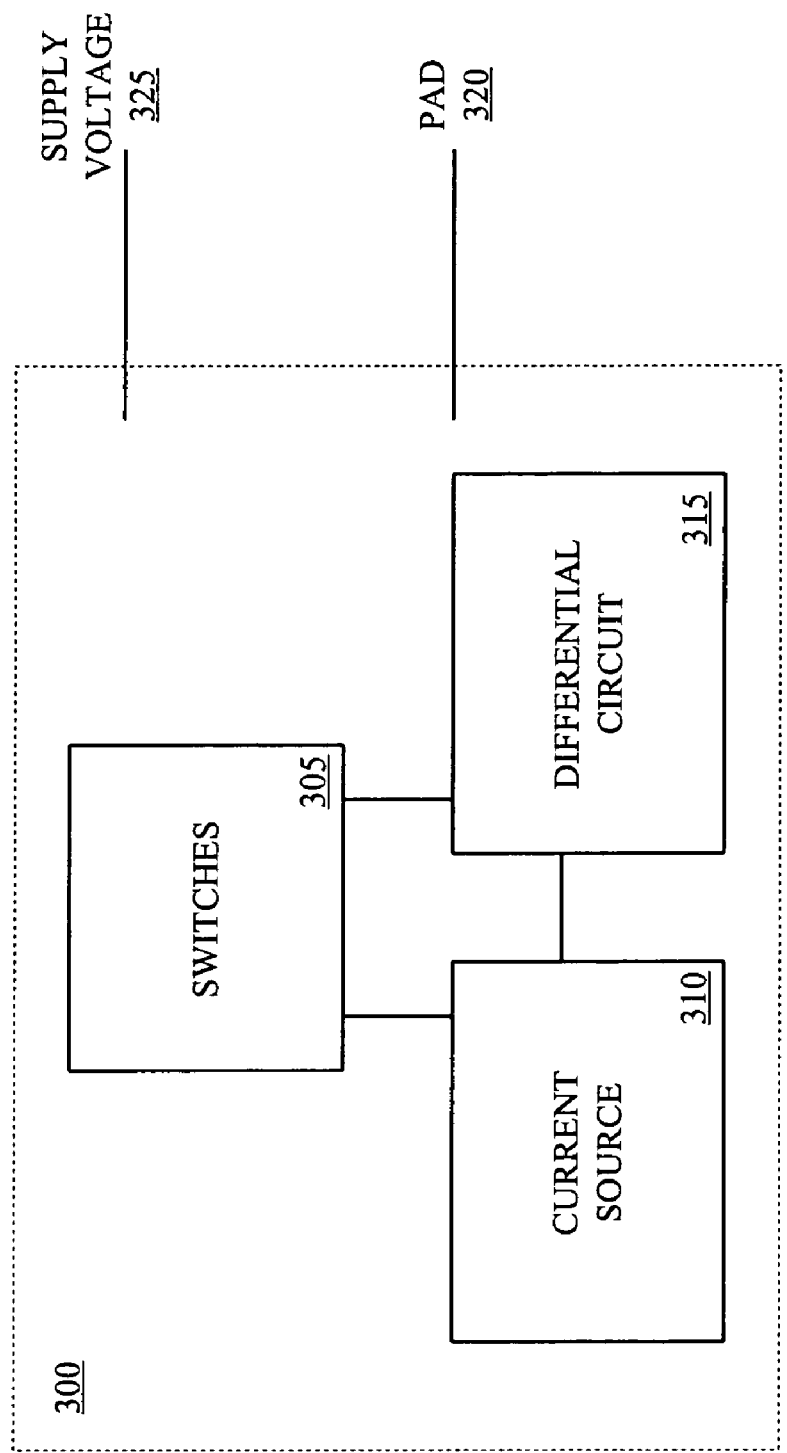
FIG. 3 is a block diagram of an embodiment of an input buffer.

FIG. 3 is a block diagram of an embodiment of an input buffer. In this embodiment, the input buffer 300 includes a current source 310 and a differential circuit 315. In one embodiment of the invention, the differential circuit 320 includes lower voltage devices, such as thin oxide MOS devices. The lower voltage devices may provide good service characteristics and relatively long life at a lower voltage.

However, in one embodiment of the invention a higher voltage operation may also be implemented. In this embodiment, there is also included a plurality of switches 305 that may be used to isolate the lower voltage devices from the higher voltages at the supply voltage 325 and the signals received at the pad connection 320 to the input buffer 300. In one embodiment, the switches 305 and the current source 315 include higher voltage devices, such as thick oxide MOS devices.

Figure 4:
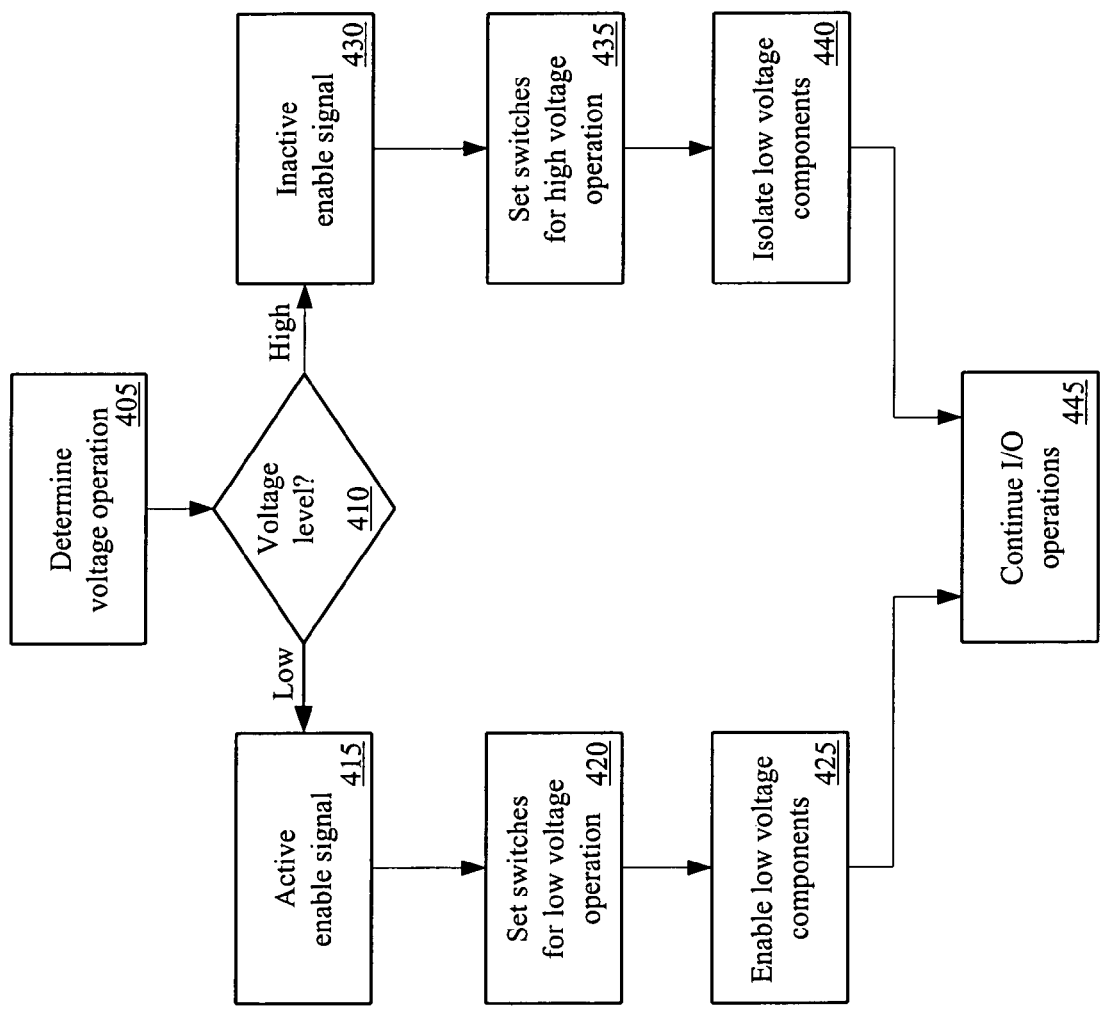
FIG. 4 is a flow chart illustrating an embodiment of operations of an input buffer.

FIG. 4 is a flow chart illustrating an embodiment of operations of an input buffer. In this embodiment, there is a determination of the voltage operation 405 for an I/O system. For example, the I/O system may provide for both lower and higher voltage operation. The voltages used in each operation may vary in different embodiments.

If the voltage level is low 410, an enable signal is activated 415. The active signal provides for setting a plurality of switches for low voltage operation 420, which enables low voltage components of the input buffer 425. The switches may allow for the application of the supply and signal voltages to the low voltage components. If the supply voltage is high 410, then the enable signal is deactivated 430. The inactive signal results in setting the plurality of switches for high voltage operations 435. In this embodiment, the low voltage components are isolated from the higher voltage 440. With either the high voltage or the low voltage setting, the I/O signal operations are then continued 445.

Figure 5:
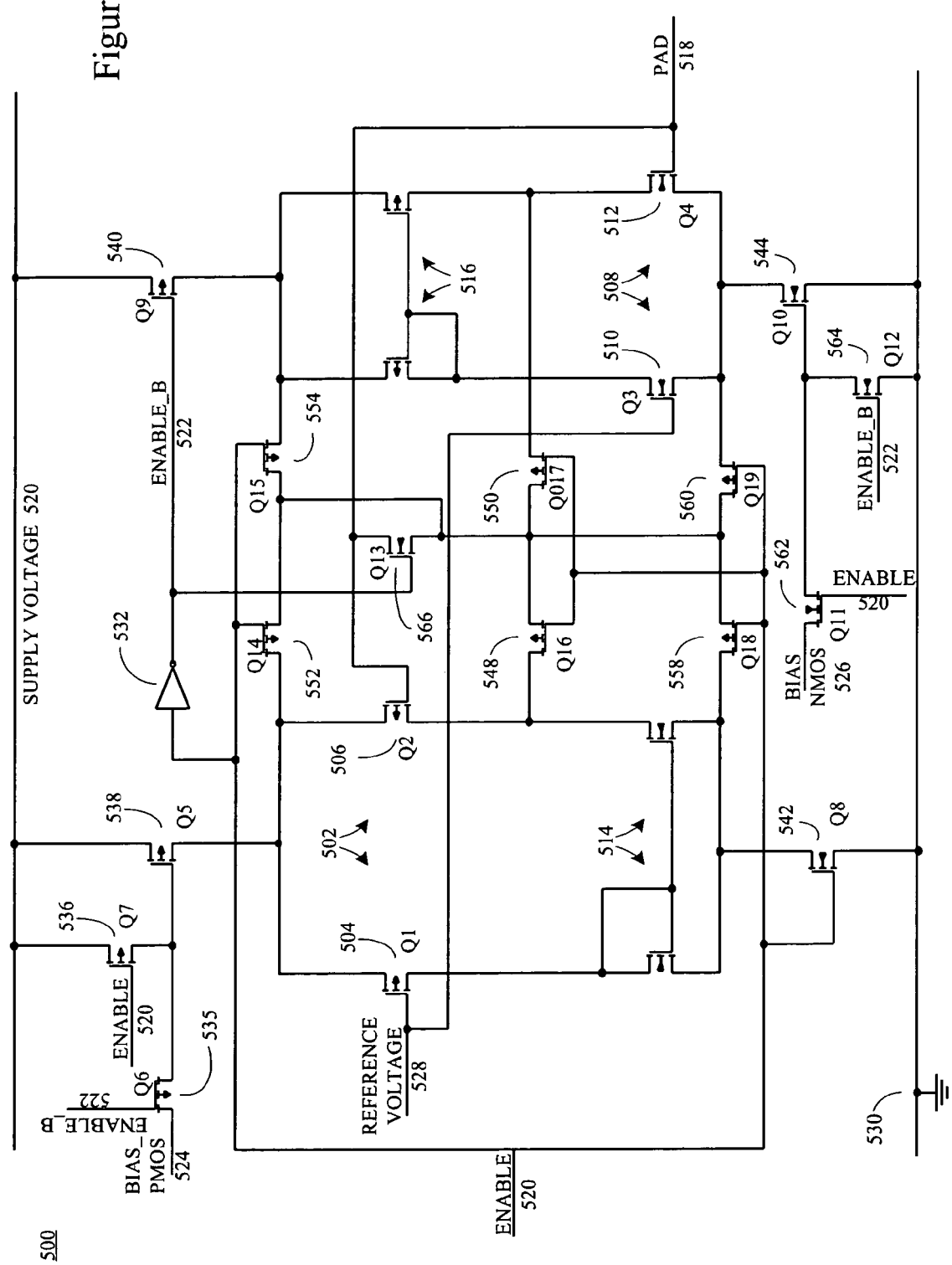
FIG. 5 is an illustration of an embodiment of a voltage tolerant input buffer.

FIG. 5 is an illustration of an embodiment of a voltage tolerant input buffer. In this embodiment, a buffer 500 includes a first differential transistor pair 502 and a second differential transistor pair 508. As illustrated, the first differential transistor pair 502 includes a pair of PMOS transistor devices, a first PMOS transistor device 504 (Q1) and a second PMOS transistor device 506 (Q2). The second differential transistor pair 508 includes a pair of NMOS devices, a first NMOS transistor device 510 (Q3) and a second NMOS transistor device 512 (Q4).

The sources of the first differential transistor pair 502 are coupled with a MOS transistor device switch 538 (Q5), the Q5 MOS device being coupled to a supply voltage 520. The gate of Q5 538 is coupled with the drains of a MOS transistor device switch 535 (Q6) and a MOS transistor device switch 536 (Q7). The source of Q7 536 is coupled with the supply voltage 520, while the gate of such device is coupled with an enable signal 520. The source of the Q6 535 is coupled with a PMOS bias voltage 524, while the gate of such device is coupled with the inverse of the enable signal, enable_b 522. The drains of the first differential transistor pair 502 are coupled with a first current source 514, which is constructed as a current mirror utilizing two NMOS transistor devices. The first current source is also coupled with a MOS transistor device switch 542 (Q8), which is in turn coupled with ground 530. The Q8 device 542 is controlled at the gate of such device by the enable signal 520.

The sources of the second differential transistor pair 508 are coupled with a second current source 516, which is constructed as a current mirror utilizing two PMOS devices. The second current source 516 is also coupled with a MOS device switch 540 (Q9), the gate of which receives the inverse enable signal enable_b 522, such as through an inverter 532 that is connected to the enable signal 520. The drains of the second differential transistor pair 508 are coupled with a MOS transistor device switch 544 (Q10), which is also coupled with ground 530. The gate of the Q10 device 544 is coupled with the sources of a MOS transistor device switch 562 (Q11) and a MOS device 564 (Q12). The drain of the Q12 device 564 is coupled with ground 530, while the drain of such device is coupled with inverse enable signal, enable_b 522. The drain of the Q11 device 562 is coupled with an NMOS bias voltage 526, while the drain of such device is coupled with the enable signal 520.

A reference voltage 528 is coupled with the gate of the Q1 device 504 of the first differential transistor pair 502 and is coupled with the gate of the Q3 device 510 of the second differential transistor pair 508. A pad connection 518 to the input buffer 500 is coupled with the gate of the Q2 device 506 of the first differential transistor pair 502 and the gate of the Q4 device 512 of the second differential transistor pair 508. The pad 518 is further coupled with a MOS transistor switch 566 (Q13). The gate of the Q13 device 566 is coupled with enable_b 522, and thus such device is activated then the enable signal is inactive for high voltage service. The drain of the Q13 566 is coupled with multiple MOS transistor devices, illustrated as MOS devices Q14 552, Q15 554, Q16 548, Q17 550, Q18 558, and Q19 560. The gates of the multiple MOS devices are coupled with the enable signal 520.

In one embodiment of the invention, the differential transistor pairs 502 and 508 and current sources 514 and 516 utilize lower voltage devices, such as thin oxide MOS devices. When the enable signal 520 is high, indicating a low voltage operation, the buffer 500 enables the switches to allow the low voltage to be applied to the low voltage devices. When the enable signal 520 is low, indicating a high voltage operation, the buffer 500 isolates the low voltage devices from the higher voltage. At the same time, the enable_b signal is high, thereby activating the Q13 switch coupled with the signal at the I/O pad 518, thereby providing the signal across the transistor devices Q14–Q19 552–560. An embodiment of the invention provides acceptable operation both at the high and low voltage levels. At the low voltage level, the low voltage devices provide for good operating characteristics at the signal voltage level. At the high voltage level, the low voltage devices are protected from over-voltage damages, while still providing acceptable operational characteristics.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices may be shown in block diagram form.

The present invention includes various processes. Certain processes of the present invention may be performed by hardware components or may be embodied in machine-executable instructions, which may be used to cause a general-purpose or special-purpose processor or logic circuits programmed with the instructions to perform the processes. Alternatively, the processes may be performed by a combination of hardware and software.

Methods herein may be described in their most basic form, but processes can be added to or deleted from any of the methods and information can be added or subtracted from any described messages without departing from the basic scope of the present invention. It will be apparent to those skilled in the art that many further modifications and adaptations can be made. The particular embodiments are not provided to limit the invention but to illustrate it. The scope of the present invention is not to be determined by the specific examples provided above but only by the claims below.

It should also be appreciated that reference throughout this specification to "one embodiment" or "an embodiment" means that a particular feature may be included in the practice of the invention. Similarly, it should be appreciated that in the foregoing description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment.

What is claimed is:

1. A buffer circuit comprising:
   a differential circuit, the differential circuit comprising a first differential transistor pair and a second differential transistor pair, the first differential transistor pair and the second differential transistor pair being complementary; and
   a plurality of switches coupled with the differential circuit;
   wherein the plurality of switches apply a voltage to the differential circuit in a first state and isolate the differential circuit from the voltage in a second state, the voltage being at a higher potential in the second state than in the first state, and wherein the buffer circuit is to operate in both the first state and the second state.

2. The buffer circuit of claim 1, further comprising an enable line coupled with the plurality of switches, the enable line to control the operation of the plurality of switches.

3. The buffer circuit of claim 1, wherein the first differential transistor pair comprises N-channel metal oxide semiconductor field effect transistors (MOSFETs) and the second differential transistor pair comprises P-channel MOSFETs.

4. The buffer circuit of claim 3, wherein the first differential transistor pair and the second differential transistor pair comprise thin oxide devices.

5. The buffer circuit of claim 1, further comprising an input/output (I/O) pad coupled with a transistor, the transistor providing a signal from the input/output pad to a tail node and an output node of the first differential transistor pair and the second differential transistor pair in the second state.

6. The buffer circuit of claim 1, wherein the differential circuit comprises a first current source coupled with the first differential transistor pair and a second current source coupled with the second differential transistor pair.

7. An input buffer comprising:
   a first differential transistor pair;
   a first current source coupled with the first differential transistor pair;
   a second differential transistor pair, the second differential transistor pair being complementary to the first differential transistor pair;
   a second current source, the second current source being coupled with the second differential transistor pair; and
   one or more switches, the one or more switches to turn on the first current source when a voltage source is at a first voltage and to turn off the first current source when the voltage source is at a second voltage, the second voltage being higher than the first voltage;
   wherein the input buffer is to operate at both the first voltage and the second voltage.

8. The input buffer of claim 7, wherein the first differential transistor pair comprises metal oxide semiconductor field effect transistor (MOSFET) devices.

9. The input buffer of claim 8, wherein the first differential transistor pair comprises thin oxide devices.

10. The input buffer of claim 8, wherein the current source comprises thick oxide devices.

11. The input buffer of claim 8, wherein the one or more switches comprise thick oxide devices.

12. A method comprising:
    receiving an enable signal for an I/O (input/output) system input buffer;
    providing a power supply voltage to the input buffer when the enable signal is active;
    separating the input buffer from the power supply voltage when the enable signal is inactive; and
    performing I/O operations when the enable signal is active and when the enable signal is inactive.

13. The method of claim 12, wherein the input buffer comprises one or more differential transistor pairs.

14. The method of claim 13, wherein providing the power supply voltage to the input buffer comprises enabling one or more current sources for the input buffer, each current source being coupled with one of the one or more differential transistor pairs.

15. The method of claim 14, wherein separating the input buffer from the power supply voltage comprises disabling the one or more current sources and activating a transistor.

16. The method of claim 15, wherein activating the transistor comprises applying a signal from an input/output (I/O) pad to the one or more differential transistor pairs.

17. The method of claim 12, wherein the enable signal is active when the power supply voltage is at a first voltage and the enable signal is inactive when the power supply voltage is at a second voltage, the second voltage being higher than the first voltage.

18. A buffer circuit comprising:
    a differential circuit, the differential circuit comprises a first differential transistor pair and a second differential transistor pair, the first differential transistor pair and the second differential transistor pair being complementary;
    a plurality of switches coupled with the differential circuit, wherein the plurality of switches are to apply a voltage to the differential circuit in a first state and isolate the differential circuit from the voltage in a second state; and
    an input/output (I/O) pad coupled with a transistor, the transistor providing a signal from the input/output pad to a tail node and an output node of the first differential transistor pair and the second differential transistor pair in the second state.

* * * * *